(12) United States Patent
Akimoto et al.

(10) Patent No.: US 8,481,377 B2
(45) Date of Patent: Jul. 9, 2013

(54) METHOD FOR MANUFACTURING A SEMICONDUCTOR DEVICE WITH IMPURITY DOPED OXIDE SEMICONDUCTOR

(75) Inventors: Kengo Akimoto, Atsugi (JP); Ryosuke Watanabe, Ebina (JP); Masashi Tsubuku, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 27 days.

(21) Appl. No.: 13/026,518

(22) Filed: Feb. 14, 2011

(65) Prior Publication Data

US 2011/0204362 A1    Aug. 25, 2011

(30) Foreign Application Priority Data

Feb. 19, 2010    (JP) .................................. 2010-035423

(51) Int. Cl.
*H01L 21/338*    (2006.01)
(52) U.S. Cl.
USPC ........... 438/181; 438/149; 438/151; 438/161; 257/43
(58) Field of Classification Search
USPC .................. 438/149, 151, 161, 181; 257/43
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Jeon et al., "180nm Gate Length Amorphous InGaZnO Thin Film Transistor for High Density Image Sensor Applications," IEDM 10, pp. 504-507 (2010).

(Continued)

*Primary Examiner* — Eva Y Montalvo
(74) *Attorney, Agent, or Firm* — Eric J. Robinson; Robinson Intellectual Property Law Office, P.C.

(57) ABSTRACT

It is an object to provide a semiconductor device including an oxide semiconductor, in which miniaturization of a transistor is achieved and the concentration of an electric field is relieved. The width of a gate electrode is reduced and a space between a source electrode layer and a drain electrode layer is shortened. By adding a rare gas in a self-alignment manner with the use of a gate electrode as a mask, a low-resistance region in contact with a channel formation region can be provided in an oxide semiconductor layer. Accordingly, even when the width of the gate electrode, that is, the line width of a gate wiring is small, the low-resistance region can be provided with high positional accuracy, so that miniaturization of a transistor can be realized.

18 Claims, 11 Drawing Sheets

U.S. PATENT DOCUMENTS

| | | | |
|---|---|---|---|
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,804,091 B2 | 9/2010 | Takechi et al. | |
| 8,232,124 B2 | 7/2012 | Takechi et al. | |
| 8,247,273 B2* | 8/2012 | Makita et al. | 438/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1* | 11/2007 | Kim et al. | 257/43 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0032668 A1* | 2/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | | |
|---|---|---|---|
| GB | 2309823 | | 8/1997 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2003-257989 | A | 9/2003 |
| JP | 2004-103957 | A | 4/2004 |
| JP | 2004-273614 | A | 9/2004 |
| JP | 2004-273732 | A | 9/2004 |
| JP | 2007-096055 | A | 4/2007 |
| JP | 2007-123861 | A | 5/2007 |
| JP | 2007-220816 | | 8/2007 |
| JP | 2008-040343 | A | 2/2008 |
| JP | 2010-003822 | | 1/2010 |
| WO | WO-2004/114391 | | 12/2004 |
| WO | WO2009/011084 | * | 1/2009 |

OTHER PUBLICATIONS

International Search Report (Application No. PCT/JP2011/052074) Dated Mar. 15, 2011.

Written Opinion (Application No. PCT/JP2011/052074) Dated Mar. 15, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-Crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", ADV. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

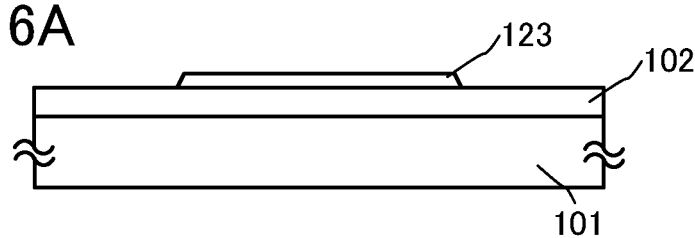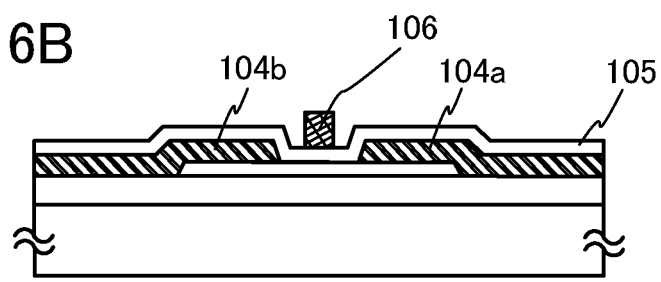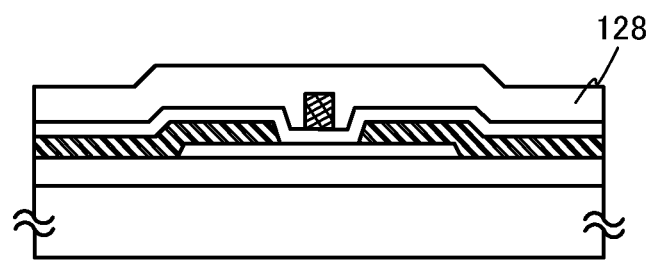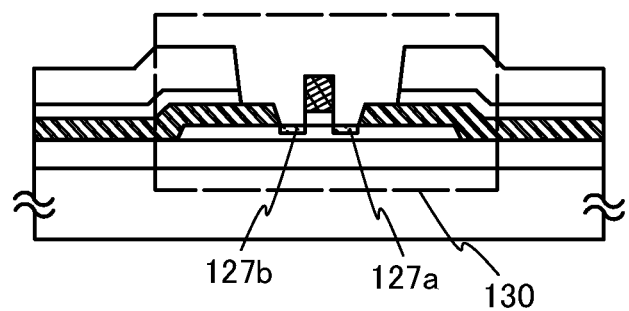

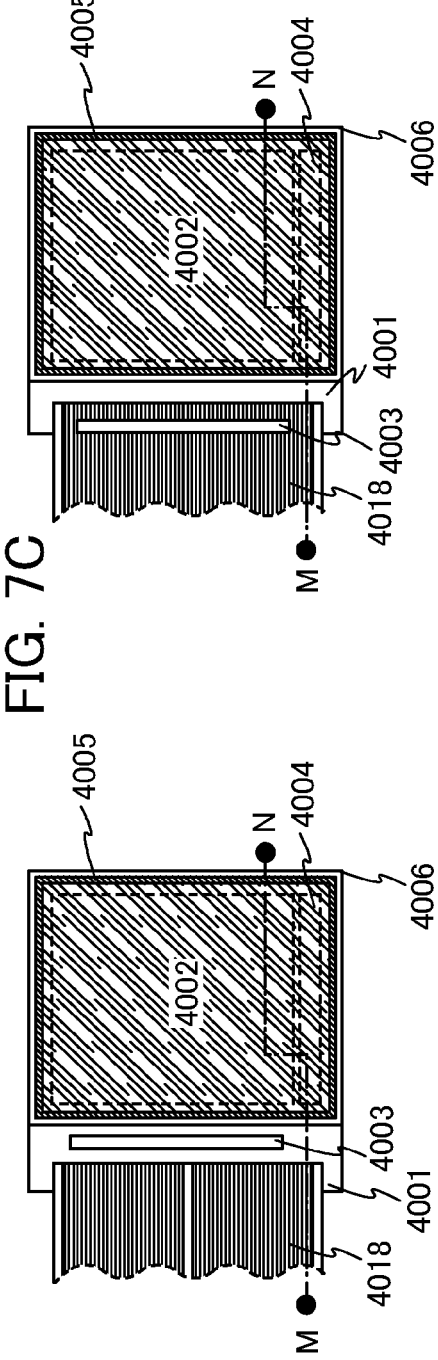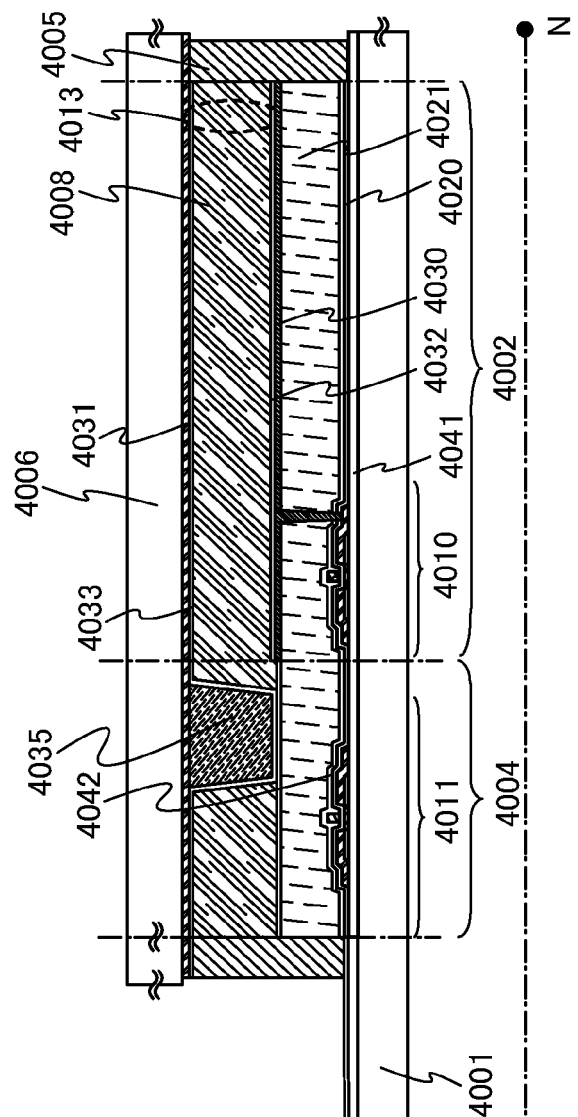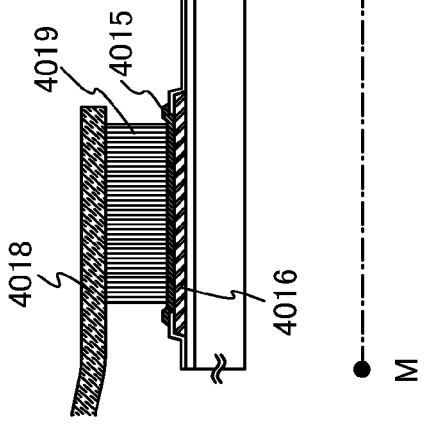

METHOD FOR MANUFACTURING A SEMICONDUCTOR DEVICE WITH IMPURITY DOPED OXIDE SEMICONDUCTOR

TECHNICAL FIELD

The present invention relates to a semiconductor device having a circuit formed using a transistor and a manufacturing method thereof. For example, the present invention relates to an electronic device on which an electro-optical device typified by a liquid crystal display panel, a light-emitting display device including an organic light-emitting element, a power device, or a memory is mounted as its component.

In this specification, a semiconductor device generally means a device which can function by utilizing semiconductor characteristics, and an electro-optical device, a semiconductor circuit, and an electronic device are all semiconductor devices.

BACKGROUND ART

In recent years, a technique for forming transistors using a semiconductor thin film (with a thickness of several nanometers to several hundreds of nanometers) formed over a substrate having an insulating surface has attracted attention. The transistors are widely used for electronic devices such as ICs or electro-optical devices.

Further, a technique in which a transistor including an oxide semiconductor is manufactured and applied to an electronic device or an optical device has attracted attention. For example, a technique of manufacturing a transistor by using zinc oxide or In—Ga—Zn—O-based oxide as an oxide semiconductor, and using the transistor for a switching element of a pixel of a display device and the like is disclosed in Patent Document 1 and Patent Document 2.

REFERENCE

[Patent Document 1] Japanese Published Patent Application No. 2007-123861
[Patent Document 2] Japanese Published Patent Application No. 2007-096055

DISCLOSURE OF INVENTION

In order to achieve high-speed operation of a transistor, low power consumption, cost reduction, or the like of a semiconductor device including the transistor, it is necessary to miniaturize a transistor.

In view of this, it is an object according to one embodiment of the disclosed invention to provide a semiconductor device that includes an oxide semiconductor and is reduced in size with favorable electric characteristics.

In the case where a transistor is miniaturized, parasitic capacitance of a transistor itself can be reduced, so that the transistor is capable of high-speed operation.

When circuit integration or high speed operation is conducted with the miniaturization of the transistor, an electric field applied to the transistor is also increased. In a transistor, particularly, an electric field is likely to concentrate in a drain terminal, and a transistor preferably has a structure in which concentration of an electric field is relieved.

In view of this, it is another object according to one embodiment of the disclosed invention to provide a semiconductor device including an oxide semiconductor, in which miniaturization is achieved and the concentration of an electric field is relieved.

In an active matrix display device including a transistor, high quality display images obtained by increasing the number of pixels per unit area has been desired; however, the ratio of an area occupied by wirings or electrodes or the like to that of an image display region is higher, so that the aperture ratio decreases.

In view of this, it is another object according to one embodiment of the disclosed invention to improve the aperture ratio per unit area by miniaturizing a transistor to achieve bright image display.

Further, in manufacturing a power device, it is another object to provide a semiconductor device having a device structure in which concentration of an electric field is relieved.

Current which flows when a transistor is in an off state is called "leakage current", which affects all the circuits of a semiconductor device and causes an increase in power consumption. In view of this, a transistor including an oxide semiconductor layer is manufactured, and low power consumption of a semiconductor device is realized. Further, since the leakage current of a transistor including an oxide semiconductor layer is small, in the case of a display device, a pixel capacitor provided together with a transistor in a pixel can be designed small and thus, a display device in which the aperture ratio is increased and is capable of a bright display image can be realized.

In order to miniaturize a transistor, the width of a gate electrode is miniaturized and a space between a source electrode layer and a drain electrode layer (a distance between the source electrode layer and the drain electrode layer of a cross section in the thickness direction of a substrate) is shortened, whereby high-speed driving of a transistor can be achieved. In an oxide semiconductor layer, a low-resistance region (also referred to as an n⁻ region) is formed in contact with a channel formation region overlapping with the gate electrode with a gate insulating layer interposed therebetween, whereby a structure in which concentration of an electric field applied to a drain terminal is relieved is obtained.

The low-resistance region in the oxide semiconductor layer is formed by adding a rare gas element (Ar, Xe, Kr, Ne, or He) to the oxide semiconductor layer. The addition of the rare gas element is performed by using an ion implantation apparatus, an ion doping apparatus, a plasma treatment apparatus, an ICP (Inductively Coupled Plasma) type etching apparatus, or the like. Note that the ICP type etching apparatus is an etching apparatus using inductively coupled plasma. A multi-spiral-type ICP etching apparatus in which a coil is divided in order to lower inductance of the coil or a spoke-type ICP etching apparatus in which a comb-like coil is arranged in a circular flat plate can be used. Further, the etching apparatus is not limited to the ICP type etching apparatus, a RIE etching apparatus such as a parallel plate type etching apparatus, an ECR etching apparatus, or a magnetron type etching apparatus can be used.

One embodiment of the present invention disclosed in this specification is a semiconductor device which includes an oxide semiconductor layer over an insulating surface; a gate insulating layer over the oxide semiconductor layer; and a gate electrode over the gate insulating layer, wherein the oxide semiconductor layer includes a channel formation region overlapping with the gate electrode with the gate insulating layer interposed therebetween and a low-resistance region which is in contact with the channel formation region and contains a rare gas at higher concentration than that of the channel formation region.

With the above structure, a path of current which flows from the source electrode layer to the drain electrode layer includes at least the source electrode layer, a region of the oxide semiconductor layer in contact with the source electrode layer, the channel formation region, the low-resistance region, a region of the oxide semiconductor layer in contact with the drain electrode layer, and the drain electrode layer, so that a structure in which concentration of an electric field applied to the drain terminal is relieved is obtained.

With the above structure, at least one of the above problems can be resolved.

For example, when a power device that has a transistor including an i-type or substantially i-type oxide semiconductor in a channel region is manufactured, in a region of the oxide semiconductor which overlaps with neither the gate electrode nor the drain electrode layer, the amount of flowing current is extremely small. When the voltage applied to the drain electrode layer is high, there is a problem of gate leakage due to a tunneling effect or the like. Here, a rare gas is added to a region which does not overlap with the gate electrode, so that the low-resistance region ($n^-$ region) serving as a drift layer can be formed. By providing the low-resistance region ($n^-$ region), a device structure in which concentration of an electric field is relieved is realized.

Note that the source and the drain of a transistor may change by operating conditions of circuits or the like. For example, in a transistor which is connected to a pixel electrode of a liquid crystal display device, in order to prevent deterioration of a liquid crystal material, the polarity of a voltage is inverted at a constant frequency, that is, inversion driving is performed, whereby the source and the drain are changed.

In view of this, further, a second low-resistance region may be formed in the same steps as the low-resistance region so that the channel formation region is interposed between the second low-resistance region and the low-resistance region. The transistor has a structure in which the second low-resistance region which is in contact with the channel formation region and contains a rare gas at higher concentration than that of the channel formation region is included, and the channel formation region is interposed between the second low-resistance region and the low-resistance region. In this case, the path of current which flows from the source electrode layer to the drain electrode layer includes at least the source electrode layer, a region of the oxide semiconductor layer in contact with the source electrode layer, the second low-resistance region, the channel formation region, the low-resistance region, a region of the oxide semiconductor layer in contact with the drain electrode layer, and the drain electrode layer, so that a structure in which concentration of an electric field applied to the drain terminal is relieved can be obtained, even when the source and drain are changed by operating conditions or the like.

Furthermore, a manufacturing method for obtaining the above described structure is also one embodiment of the present invention. A manufacturing method of a semiconductor device includes the steps of forming an oxide semiconductor layer over an insulating surface; forming a source electrode layer and a drain electrode layer over and partly in contact with the oxide semiconductor layer; forming an insulating layer over and in contact with the oxide semiconductor layer, the source electrode layer, and the drain electrode layer; forming a gate electrode over the insulating layer and overlapping with the oxide semiconductor layer; and adding a rare gas to part of the oxide semiconductor layer in a self-alignment manner with the use of the gate electrode, the source electrode layer and the drain electrode layer as masks through the insulating layer.

A manufacturing method in which the source electrode layer and the drain electrode layer are formed before the oxide semiconductor layer is formed may be employed. A manufacturing method of a semiconductor device includes the steps of forming a source electrode layer and a drain electrode layer over an insulating surface; forming an oxide semiconductor layer over and partly in contact with the source electrode layer and the drain electrode layer; forming an insulating layer over and in contact with the oxide semiconductor layer, the source electrode layer, and the drain electrode layer; forming a gate electrode over the insulating layer and overlapping with the oxide semiconductor layer; and adding a rare gas to part of the oxide semiconductor layer in a self-alignment manner with the use of the gate electrode as a mask through the insulating layer.

A manufacturing method in which the oxide semiconductor layer is exposed before a rare gas is added may be employed. A manufacturing method of a semiconductor device includes the steps of forming an oxide semiconductor layer over an insulating surface; forming a source electrode layer and a drain electrode layer over and partly in contact with the oxide semiconductor layer; forming an insulating layer over and in contact with the oxide semiconductor layer, the source electrode layer, and the drain electrode layer; forming a gate electrode over the insulating layer and overlapping with the oxide semiconductor layer; etching the insulating layer selectively so that part of the oxide semiconductor layer is exposed; and adding a rare gas to the exposed part of the oxide semiconductor layer.

When part of the oxide semiconductor layer is exposed and a rare gas is added, by plasma treatment using a plasma treatment apparatus, an ICP type etching apparatus, or the like, a rare gas at higher concentration than the channel formation region can be added to an area in the range of 5 nm from a surface of the exposed oxide semiconductor layer.

The insulating layer formed between the gate electrode and the oxide semiconductor layer serves as the gate insulating layer and is in contact with the oxide semiconductor layer. Further, the oxide semiconductor layer is in contact with a base insulating layer, thus the oxide semiconductor layer can be interposed between the gate insulating layer and the base insulating layer. The base insulating layer is preferably formed by a sputtering method. By forming the base insulating layer by a sputtering method, the oxide semiconductor layer and the gate insulating layer can be also formed by a sputtering method. Therefore, the base insulating layer, the oxide semiconductor layer and the gate insulating layer can be formed by using the same sputtering apparatus.

As an oxide semiconductor used for the oxide semiconductor layer, an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, or a Zn—O-based oxide semiconductor, or the like can be used. Further, $SiO_2$ may be contained in the above oxide semiconductor. Note that here, for example, an In—Ga—Zn—O-based oxide semiconductor means an oxide containing indium (In), gallium (Ga), and zinc (Zn), and there is no particular limitation on the stoichiometric proportion thereof. Further, the In—Ga—Zn—O-based oxide semiconductor may contain an element other than In, Ga, and Zn.

As for the oxide semiconductor layer, when an In—Ga—Zn—O-based oxide semiconductor is used, heat treatment may be performed at more than or equal to 400° C. before a rare gas is added. With the use of the oxide semiconductor layer in which hydrogen concentration is sufficiently reduced by heat treatment at more than or equal to 400° C. and less than the strain point of the substrate (i.e., the purified oxide semiconductor layer), the off current of the transistor can be reduced.

The oxide semiconductor layer is an oxide semiconductor made to be an intrinsic (i-type) or substantially intrinsic by removal of hydrogen that is an n-type impurity to be highly purified so that impurities that are not main components of the oxide semiconductor are contained as little as possible. In other words, a feature is that a purified i-type (intrinsic) semiconductor, or a semiconductor close thereto, is obtained not by adding an impurity but by removing an impurity such as hydrogen or water as much as possible. This enables the Fermi level ($E_f$) to be at the same level as the intrinsic Fermi level (Ei).

For example, even when a transistor has a channel width (W) of $1 \times 10^4$ μm and a channel length of 3 μm, the off current can be $10^{13}$ A or less and S value can be 0.1 V/decade at room temperature (with a 100-nm-thick gate insulating layer). Further, the amount of current per micrometer of channel width (W) in the transistor is 100 aA/μm or less, preferably 10 zA/μm or less, more preferably 1 zA/μm or less.

As described above, the oxide semiconductor is purified so that impurities that are not main components of the oxide semiconductor are contained as little as possible, whereby favorable operation of the transistor can be obtained. In a transistor including a purified oxide semiconductor layer, variation in characteristics of the transistor due to photodegradation is small.

The above oxide semiconductor is an oxide semiconductor which made to be highly purified and which is made to be electrically i-type (intrinsic) as follows: an impurity such as hydrogen, moisture, a hydroxy group, or hydride (also referred to as a hydrogen compound), which is a factor of the variation in electric characteristics, is intentionally eliminated in order to suppress the variation, and oxygen which is a main component of the oxide semiconductor and which is reduced by an impurity elimination process is supplied.

A rare gas, typically, argon is added to the oxide semiconductor layer which is highly purified by reducing the hydrogen concentration in the oxide semiconductor layer by performing heat treatment at more than or equal to 400° C. and less than the strain point of the substrate in a self-alignment manner with the use of the gate electrode as a mask. At the time of film formation of the oxide semiconductor layer by sputtering, an argon gas is used; therefore, the oxide semiconductor layer contains a small amount of argon just after the film formation. The amount of argon added at the time of the formation is very small, and even when heat treatment is performed at 450° C. in vacuum, argon is hardly discharged and is hardly detected by TDS. When argon is added after the gate electrode is formed, the channel formation region overlapping with the gate electrode, to which argon is not added and the low-resistance region to which argon is added have a difference of a concentration of argon.

By adding a rare gas with the use of the gate electrode as a mask in a self-alignment manner, the low-resistance region in contact with the channel formation region can be provided in the oxide semiconductor layer. Accordingly, even when the width of the gate electrode, that is, the line width of a gate wiring is small, the low-resistance region can be provided with high positional accuracy, so that miniaturization of a transistor can be realized.

According to the present invention, a transistor having line width of the gate wiring of less than 1 μm, for example, 0.25 μm or 0.13 μm can be realized.

BRIEF DESCRIPTION OF DRAWINGS

FIGS. 6A to 6D are cross-sectional views of one embodiment of the present invention.

FIGS. 7A to 7C are top views and a cross-sectional view of one embodiment of the present invention.

FIGS. 8A-1, 8A-2 and 8B are circuit diagrams of one embodiment of the present invention.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, a manufacturing example of a transistor including a low-resistance region formed by adding a rare gas in a self-alignment manner through an insulating layer is described below.

Figure 1A:
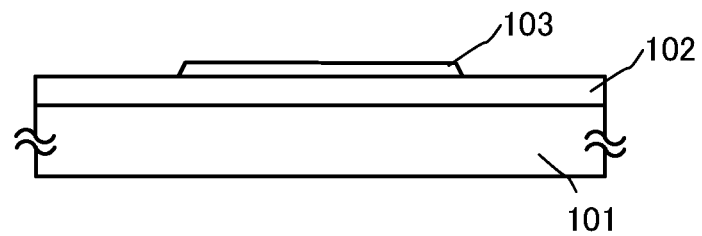
FIGS. 1A to 1C are cross-sectional views of one embodiment of the present invention.
Figure 1B:
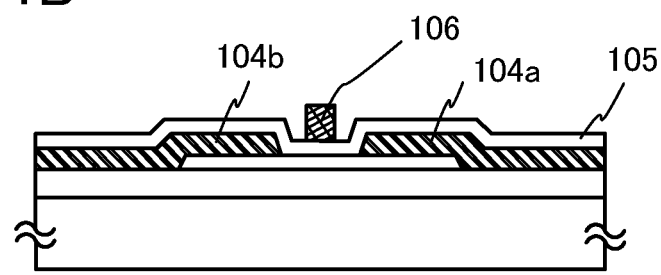

A process of manufacturing a transistor 110 over a substrate 101 will be described below with reference to FIGS. 1A to 1C. The transistor 110 illustrated in FIG. 1C has a top-gate structure.

Firstly, a base insulating layer 102 is formed over the substrate 101 having an insulating surface. The base insulating layer 102 has the function of preventing diffusion of an impurity element from the substrate 101, and can be formed with a single-layer structure or a stacked-layer structure using one or more of a silicon nitride film, a silicon oxide film, a silicon nitride oxide film, and a silicon oxynitride film. In this embodiment, a glass substrate is used as the substrate 101 having an insulating surface and as the base insulating layer 102 in contact with the glass substrate, a silicon oxide film with a thickness of 100 nm is formed by a sputtering method in which silicon oxide is used for a target material.

Further, when an integrated circuit such as memory is formed, as the substrate 101 having an insulating surface, a single crystal semiconductor substrate or a polycrystalline semiconductor substrate of silicon, silicon carbide, or the like; a compound semiconductor substrate of silicon germanium or the like; or an SOI substrate may be used. The SOI substrate including a transistor manufactured in advance before the base insulating layer 102 is formed is preferably used.

Next, an oxide semiconductor film is formed, and then a first photolithography step is performed, so that the oxide semiconductor layer 103 is formed. FIG. 1A is a cross-sectional view of this stage. In this embodiment, as the oxide semiconductor film, an In—Ga—Zn—O film with a thickness of 50 nm is used. The target used for formation of the oxide semiconductor film by a sputtering method is, for example, an oxide target containing $In_2O_3$, $Ga_2O_3$, and ZnO at a composition ratio of 1:1:1 [molar ratio], so that an In—Ga—Zn—O film is formed. Without limitation to the material and the component of the target, for example, an oxide target containing $In_2O_3$, $Ga_2O_3$, and ZnO at a composition ratio of 1:1:2 [molar ratio] may be used.

Next, the oxide semiconductor layer is subjected to heat treatment. Dehydration or dehydrogenation of the oxide semiconductor layer can be performed through the heat treatment. The temperature of the heat treatment is more than or equal to 400° C. and less than or equal 750° C., or more than or equal to 400° C. and less than the strain point of the substrate. In this embodiment, with use of an RTA (rapid thermal anneal) apparatus, heat treatment is performed in a nitrogen atmosphere at 650° C. for six minutes, the substrate is introduced, without exposure to the air, into an electric furnace that is one kind of a heat treatment apparatus, heat treatment is performed in a dry air atmosphere at 450° C. for one hour on the oxide semiconductor layer, and then water and hydrogen are prevented from entering the oxide semiconductor layer; thus, the dehydrated or dehydrogenated oxide semiconductor layer is obtained.

Next, a conductive film is formed by a sputtering method, and then a second photolithography step is performed, so that a source electrode layer 104b and a drain electrode layer 104a are formed. The conductive film can be formed using a metal film containing an element selected from Al, Cr, Cu, Ta, Ti, Mo, and W as its component, an alloy film containing a nitride of any of these elements as its component, an alloy film containing a combination of any of these elements, or the like. In this embodiment, a Ti film with a thickness of 150 nm is used as the conductive film.

Next, a gate insulating layer 105 which covers the source electrode layer 104b or the drain electrode layer 104a and is partly in contact with the oxide semiconductor layer is formed. The gate insulating layer 105 can be formed with a single-layer structure or a stacked-layer structure using one or more of a silicon nitride film, a hafnium oxide film, a silicon oxide film, a silicon nitride oxide film, and a silicon oxynitride film. In this embodiment, as the gate insulating layer 105, a silicon oxide film with a thickness of 100 nm formed by a sputtering method is used.

Next, a conductive film is formed over the gate insulating layer 105. The conductive film can be formed using a metal film containing an element selected from Al, Cr, Cu, Ta, Ti, Mo, and W as its component, an alloy film containing a nitride of any of these elements as its component, an alloy film containing a combination of any of these elements, or the like. The conductive film is formed, and then a third photolithography step is performed, so that a gate electrode 106 is formed. In this embodiment, as the conductive film, a W film with a thickness of 150 nm is used. FIG. 1B is a cross-sectional view of this stage.

Light exposure at the time of the formation of the resist mask in the third photolithography step is performed using ultraviolet light, KrF laser light, or ArF laser light. The channel length of a transistor that is formed later is determined by the width of the gate electrode 106. Note that in the case where light exposure is performed so that the channel length becomes less than 25 nm, light exposure for forming the resist mask in the third photolithography step is performed using extreme ultraviolet with an extremely short wavelength of several nanometers to several tens of nanometers. In the light exposure by extreme ultraviolet, the resolution is high and the depth of focus is large. Thus, the channel length of the transistor that is formed later can be greater than or equal to 10 nm and less than or equal to 1000 nm and the operation speed of a circuit can be increased and furthermore the value of off current is extremely small, so that lower power consumption can be achieved.

Figure 1C:
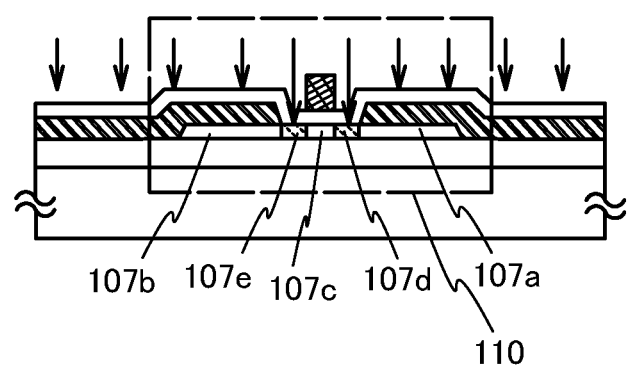

Next, as illustrated in the FIG. 1C, a rare gas is added with the use of the gate electrode 106, source electrode layer 104b and a drain electrode layer 104a as masks, so that a first low-resistance region 107d and a second low-resistance region 107e are formed in a self-alignment manner. In this embodiment, argon is added under conditions of accelerating voltage of 10 keV and dose of $2\times10^{15}/cm^2$ using an ion doping apparatus. In order to reduce damage in the gate electrode 106 due to the argon addition step, argon may be added while the resist mask used for forming the gate electrode is left over the gate electrode. In that case, the resist mask over the gate electrode is removed after argon is added.

Through the above described steps, the transistor 110 including a channel formation region 107c which overlaps with the gate electrode 106 with the gate insulating layer 105 interposed therebetween and has the channel length of from 10 nm to 1000 nm can be manufactured. Further, the first low-resistance region 107d and the second low-resistance region 107e are provided in contact with the channel formation region 107c with a channel length from 10 nm to 1000 nm, so that the transistor 110 in which concentration of an electric field applied to a drain terminal is relieved, can be manufactured.

The concentration of argon in a first region 107a of the oxide semiconductor layer in contact with and overlapping with the drain electrode layer 104a of the transistor 110 is approximately the same as that of the channel formation region 107c. The concentration of argon of a second region 107b in the oxide semiconductor layer in contact with and overlapping with the source electrode layer 104b of the transistor 110 is approximately the same as that of the channel formation region 107c.

Figure 2:
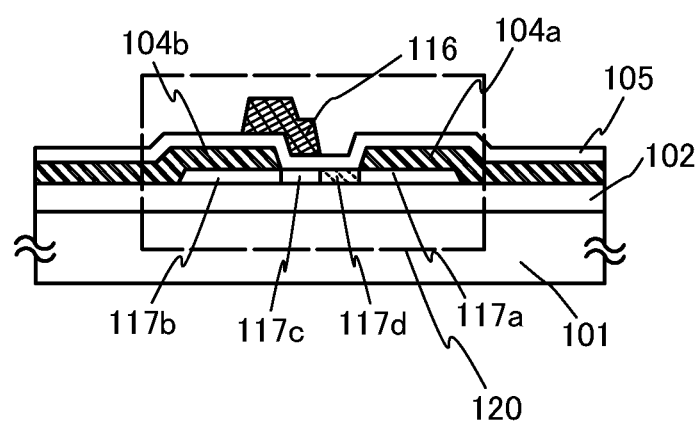
FIG. 2 is a cross-sectional view of one embodiment of the present invention.

Further, In FIG. 1C, an example where two low-resistance regions, that is, the first low-resistance region 107d and the second low-resistance region 107e are provided in the oxide semiconductor layer is shown without particular limitation. FIG. 2 illustrates an example of the cross-sectional structure of a transistor 120 in which the position of the gate electrode is different from that of FIG. 1C and one low-resistance region 117d is provided.

The transistor 120 can be manufactured using the same method as the transistor 110 shown in FIG. 1C except that the gate electrode whose position is different. Therefore, the description of the manufacturing method thereof is omitted. In FIG. 2, the same portions as those in FIG. 1A to 1C are denoted by the same reference numerals.

The transistor 120 in FIG. 2 illustrates an example in which a gate electrode 116 is formed to partly overlap with a source electrode layer 104b with a gate insulating layer 105 interposed therebetween. Therefore, by changing an exposure mask in the third photolithography step, the transistor 110 and the transistor 120 can be manufactured over the same substrate without an increase in the number of steps.

By the addition of argon, a low-resistance region 117d is provided adjacent to a channel formation region 117c and contains argon at higher concentration than that of the channel formation region 117c. The transistor 120 has a structure in which the low-resistance region 117d is formed in contact with the channel formation region 117c and concentration of an electric field applied to a drain terminal is relieved. The channel formation region 117c is part of the oxide semiconductor layer overlapping with the gate electrode 116 with the gate insulating layer 105 interposed therebetween. The concentration of argon of the channel formation region 117c is approximately the same as that of a first region 117a of the oxide semiconductor layer in contact with and overlapping with a drain electrode layer 104a.

The structure of the transistor 110 is used for a transistor in which a source and a drain are changed by operating conditions of circuits or the like and the structure of the transistor 120 is used for a transistor in which a source and a drain are not changed by operating conditions of circuits or the like. The transistor may be manufactured as appropriate by a practitioner in accordance with the circuits.

For example, in the case of manufacturing a power device in which a source and a drain are not changed by operating conditions of circuits or the like, the structure of the transistor 120 is used.

The low-resistance region 117d of the transistor 120 can be called a drift layer and preferably has a desired donor density by adding a rare gas, typically, argon.

A procedure for optimizing the donor density of the drift layer by a drain withstand voltage and the maximum acceptable electric-field intensity of an active layer is described below.

In general use of a power MOS, a high voltage is applied between the drain and the source in an off state. That is, drain-source voltage $V_{min}$ which must be ensured under the required specification is given. Further, the maximum acceptable electric-field intensity $E_{break}$ is determined in accordance with the materials. Here, it is examined that drain voltage $V_{ds}$ is applied to the drift layer having the donor density $N_d$. When the width of a depletion layer to be formed is W, Formula (1) is satisfied by the Poisson equation. Note that the length of the drift layer in the channel length direction is assumed to be W or more.

$$V_{ds} = \frac{q \cdot N_d}{2 \cdot \varepsilon} \cdot W^2 = \frac{E_{max} \cdot W}{2} = \frac{\varepsilon \cdot E_{max}^2}{2 \cdot q \cdot N_d} \quad \text{[FORMULA 1]}$$

Therefore, when $E_{max}=E_{break}$ is satisfied, $V_{ds}$ can represent drain-source breakdown voltage $V_{break}$. Needless to say, the relation $V_{min}<V_{break}$ needs to be satisfied. Note that the magnitude relation of $V_{break}$ and $V_{min}$ is shown in Formula (2).

$$V_{min} < V_{break} = \frac{\varepsilon \cdot E_{break}^2}{2 \cdot q \cdot N_d} \quad \text{[FORMULA 2]}$$

That is, the donor density of the drift layer is needed to satisfy the following Formula (3).

$$N_d < \frac{\varepsilon \cdot E_{break}^2}{2 \cdot q \cdot V_{min}} \quad \text{[FORMULA 3]}$$

On the other hand, the donor density of the drift layer also affects on resistance. Since $V_{ds}$ is almost equal to zero in an on state when a power MOS is generally used, the carrier density n of the drift layer at this time is approximately the same as $N_d$. Accordingly, a resistance R of the drift layer in an on state can be expressed by the following Formula (4). Note that the length of the drift layer is assumed to be equal to W.

$$R \propto \frac{1}{\sigma} \cdot W = \frac{1}{q \cdot n \cdot \mu} \cdot W = \frac{W}{q \cdot N_d \cdot \mu} \quad \text{[FORMULA 4]}$$

According to Formula (1) and Formula (4), as the donor density is higher, the resistance is lower. Therefore, the donor density of the drift layer should be as high as possible within the range satisfying Formula (3). Thus, when the donor density is determined, the length of the drift layer can be determined in accordance with the following procedure.

Firstly, when drain voltage $V_{ds}$ is applied to the drift layer having the length of d in an off state, the case where (a) the width of the depletion layer to be formed W is smaller than d and the case where (b) the depletion layer spreads over the whole drift layer are examined. When the case (a) and the case (b) have the same drain voltage $V_{ds}$ and the same length d of the drift layer, it is considered that the maximum electric-field intensity $E_{max}$ applied to an active layer of the case (b) is larger than that of the case (a).

When drain voltage $V_{ds}$ is adjusted so as to prevent $E_{max}$ from exceeding the upper limit, it can be considered that the applicable value of $V_{ds}$ of the case (a) is larger than that of the case (b). Accordingly, conditions which the length d of the drift layer should satisfy are determined Since Formula 1 is satisfied within the range of the case (a), the following Formula (5) can be made using drain withstand voltage Vmin and donor density Nd decided in the previous step.

$$d > W = \sqrt{\frac{2 \cdot \varepsilon \cdot V_{min}}{q \cdot N_d}} \quad \text{[FORMULA 5]}$$

On the other hand, considering the viewpoint of on resistance, the length d of the drift layer is preferably short. After all, it can be said that the length d of the drift layer should be as short as possible within the range satisfying Formula (5) (that is, Formula (4) can be approximately satisfied when d is almost equal to W).

The length d of the drift layer is determined by the positions where the gate electrode 116 and the drain electrode layer 104a are formed. Therefore, the length d of the drift layer is preferably determined by adjusting the donor density of the drift layer in accordance with the material of the oxide semiconductor and the amount of argon added, and then designing a mask based on the donor density.

Embodiment 2

In this embodiment, an example of manufacturing a transistor 210 whose process is partly different from that of Embodiment 1 is described below. A process of manufacturing the transistor 210 over a substrate 201 will be described below with reference to FIGS. 3A to 3C.

First, as in Embodiment 1, a base insulating layer 202 is formed over the substrate 201 having an insulating surface.

Next, a conductive film is formed by a sputtering method, and then a first photolithography step is performed, so that a source electrode layer 204b or a drain electrode layer 204a is formed. The conductive film can be formed using a metal film containing an element selected from Al, Cr, Cu, Ta, Ti, Mo, and W as its component, an alloy film containing a nitride of any of these elements as its component, an alloy film containing a combination of any of these elements, or the like. In this embodiment, as the conductive film, a W film with a thickness of 150 nm is used.

Figure 3A:
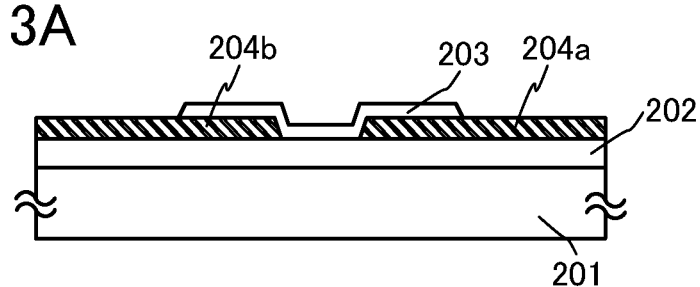
FIGS. 3A to 3C are cross-sectional views of one embodiment of the present invention.

Next, an oxide semiconductor film is formed over and in contact with a source electrode layer 204b or a drain electrode layer 204a, and then a second photolithography step is performed, so that an oxide semiconductor layer 203 is formed. FIG. 3A is a cross-sectional view of this stage. In this embodiment, as the oxide semiconductor film, an In—Ga—Zn—O film with a thickness of 100 nm is used. The target used for formation of the oxide semiconductor film by a sputtering method is, for example, an oxide target containing $In_2O_3$, $Ga_2O_3$, and ZnO at a composition ratio of 1:1:2 [molar ratio], so that an In—Ga—Zn—O film is formed.

Next, the oxide semiconductor layer is subjected to heat treatment. Dehydration or dehydrogenation of the oxide semiconductor layer can be performed through the heat treatment. The temperature of the heat treatment is more than or equal to 400° C. and less than or equal to 750° C., or more than or equal to 400° C. and less than the strain point of the substrate. Note that the materials used for forming the source electrode layer 204b or the drain electrode layer 204a can withstand the heat treatment. In this embodiment, an RTA apparatus is used, heat treatment is performed in a nitrogen atmosphere at 650° C. for six minutes, the substrate is introduced, without exposure to the air, into an electric furnace that is one kind of a heat treatment apparatus, and heat treatment is performed in a dry air atmosphere at 450° C. for one hour on the oxide semiconductor layer, and then water and hydrogen are prevented from entering the oxide semiconductor layer; thus, the oxide semiconductor layer is obtained. In this embodiment, since a W film is used as the source electrode layer 204b or the drain electrode layer 204a, the source electrode layer 204b or the drain electrode layer 204a can withstand the above heat treatment.

Next, a gate insulating layer 205 which covers the oxide semiconductor layer and is partly in contact with the source electrode layer 204b or the drain electrode layer 204a is formed. The gate insulating layer 205 can be formed with a single-layer structure or a stacked-layer structure using one or more of a silicon nitride film, a silicon oxide film, a hafnium oxide film, a silicon nitride oxide film, and a silicon oxynitride film. In this embodiment, as the gate insulating layer 205, a silicon oxide film with a thickness of 100 nm formed by a sputtering method is used.

Figure 3B:
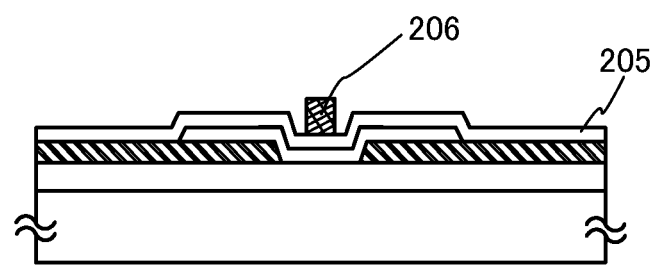

Next, a conductive film is formed over the gate insulating layer 205. The conductive film can be formed using a metal film containing an element selected from Al, Cr, Cu, Ta, Ti, Mo, and W as its component, an alloy film containing a nitride of any of these elements as its component, an alloy film containing a combination of any of these elements, or the like. After the conductive film is formed, a third photolithography step is performed, so that a gate electrode 206 is formed. In this Embodiment, a Ti film with a thickness of 200 nm is used as the conductive film. FIG. 3B is a cross-sectional view of this stage.

Figure 3C:
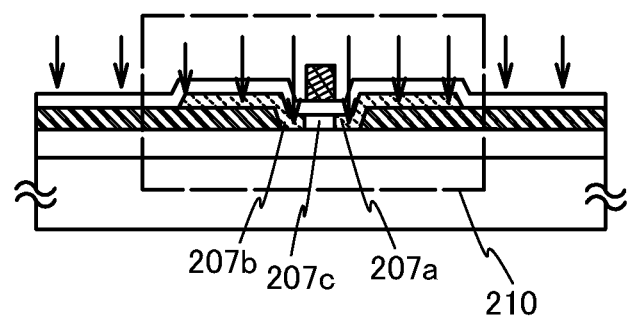

Next, as illustrated in FIG. 3C, a rare gas is added with the use of the gate electrode 206 as a mask, so that a first low-resistance region 207a and a second low-resistance region 207b are formed in a self-alignment manner. In this embodiment, ion implantation of argon is performed with the use of an ion-implantation apparatus. In order to reduce damage in the gate electrode 206 due to the step of argon ion implantation, argon ion implantation may be performed with the resist mask for forming the gate electrode left over the gate electrode. In that case, the resist mask over the gate electrode is removed after the argon ion implantation is performed.

Through the above described steps, the transistor 210 including a channel formation region 207c which overlaps with the gate electrode 206 with the gate insulating layer 205 interposed therebetween and including the first low-resistance region 207a and the second low-resistance region 207b which are in contact with the channel formation region 207c, so that concentration of an electric field applied to a drain terminal is relieved, can be manufactured.

Figure 4:
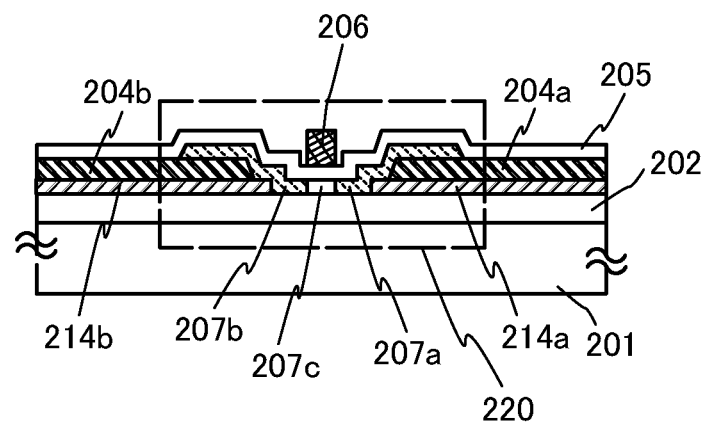
FIG. 4 is a cross-sectional view of one embodiment of the present invention.

Further, the structure is not particularly limited to the structure of the transistor 210 illustrated in FIG. 3C, and the cross-sectional structure of a transistor 220 illustrated in FIG. 4, for example, may be employed.

The transistor 220 illustrated in FIG. 4 includes a first conductive layer 214a under a drain electrode layer 204a and a second conductive layer 214b under a source electrode layer 204b. Further, the first conductive layer 214a includes a region that extends in the channel length direction from an end face of the drain electrode layer 204a, and the second conductive layer 214b includes a region that extends in the channel length direction from an end face of the source electrode layer 204b.

The transistor 220 illustrated in FIG. 4 can be manufactured using the same method as the transistor 210 shown in FIG. 3C except that the conductive layer (the first conductive layer 214a or the second conductive layer 214b) is formed under the source electrode layer 204b or the drain electrode layer 204a. Therefore, detailed description of the manufacturing method thereof is omitted here. In FIG. 4, the same portions as those in FIGS. 3A to 3C are denoted by the same reference numerals.

The first conductive layer 214a and the second conductive layer 214b are preferably formed before the source electrode layer 204b and the drain electrode layer 204a are formed. The first conductive layer 214a and the second conductive layer 214b are formed by patterning the same conductive film. The thicknesses of the first conductive layer 214a and the second conductive layer 214b are greater than or equal to 3 nm and less than or equal to 30 nm, preferably greater than or equal to 5 nm and less than or equal to 15 nm. As a material for the first conductive layer 214a and the second conductive layer 214b, a metal material with which etching selectivity of the first conductive layer 214a and the second conductive layer 214b with respect to the source electrode layer 204b and the drain electrode layer 204a can be obtained is used. Examples of such a metal material include molybdenum nitride, titanium nitride, or an indium oxide-tin oxide alloy, and the like.

Further, the thickness of the electrode in the region of the first conductive layer 214a that extends in the channel length direction from the end face of the drain electrode layer 204a is smaller than that in the other region (the region of a stacked layer of the drain electrode layer 204a and the first conductive layer 214a). That is, the area of a cross section which is perpendicular to the flow of electric charge is smaller. Since resistance is inversely proportional to the area of the cross section, the region of the first conductive layer 214a that extends in the channel length direction from the end face of the drain electrode layer 204a has higher resistance than the other region; that is, which is a high-resistance region. The same can also apply to the second conductive layer 214b.

The transistor 220 includes the high-resistance region formed from metal, whereby concentration of an electric field between the source electrode layer 204b and the drain electrode layer 204a can be relieved.

Figure 5:
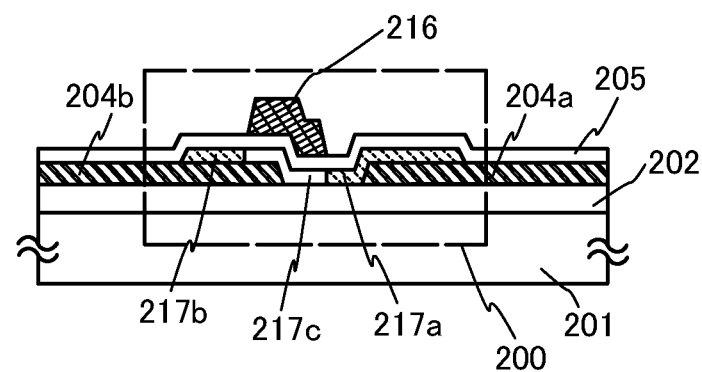
FIG. 5 is a cross-sectional view of one embodiment of the present invention.

Furthermore, FIG. 5 illustrates an example of the cross-sectional structure of the transistor 200 in which a gate electrode is provided in a position different from that of FIG. 3C and in which two low-resistance regions 217a and 217b are provided.

The transistor 200 can be manufactured using the same method as the transistor 210 shown in FIG. 3C except that the position where a gate electrode is formed is different. Therefore, the description of the manufacturing method thereof is omitted. In FIG. 5, the same portions as those in FIGS. 3A to 3C are denoted by the same reference numerals.

The transistor 200 in FIG. 5 illustrates an example in which a gate electrode 216 is formed to partly overlap with a source electrode layer 204b with a gate insulating layer 205 interposed therebetween. Therefore, by changing an exposure mask in the third photolithography step, the transistor 210, and the transistor 200 can be manufactured over the same substrate without an increase in the number of steps.

By the addition of argon, the low-resistance region 217a is provided to be adjacent to the channel formation region 217c and contains argon at higher concentration than the channel formation region 217c. The transistor 200 has a structure in which the low-resistance region 217a is formed in contact with the channel formation region 217c and concentration of an electric field applied to a drain terminal is relieved. The channel formation region 217c is part of an oxide semiconductor layer which overlaps with the gate electrode 216 with the gate insulating layer 205 interposed therebetween. Further, the low-resistance region 217b overlapping with the source electrode layer 204b is not necessarily provided. In the case of employing a step in which argon is added, the low-resistance region 217b and the low-resistance region 217a are formed at the same time in a self-alignment manner.

The structure of the transistor 210 is used for a transistor in which a source and a drain are changed by operating conditions of circuits or the like and the structure of the transistor 200 is used for a transistor in which a source and a drain are not changed by operating conditions of circuits or the like. The transistor may be manufactured as appropriate by a practitioner in accordance with the circuits.

For example, in the case of manufacturing a power device in which a source and a drain are not changed by operating conditions of circuits or the like, the structure of the transistor 200 is used.

The low-resistance region 217a of the transistor 200 can be called a drift layer and preferably has a desired donor density by adding a rare gas, typically, argon. Furthermore, the length d of the drift layer in the channel length direction may be determined in accordance with the procedure shown in Embodiment 1.

Note that this embodiment can be freely combined with Embodiment 1.

Embodiment 3

In this embodiment, an example of manufacturing a transistor in which an In—Zn—O-based oxide semiconductor layer is partly exposed, and then plasma treatment is performed using an argon gas on the exposed region by an ICP etching apparatus, is described.

In this embodiment, an example of manufacturing a transistor 130 whose process and materials are partly different from those of Embodiment 1 is described below. A process for manufacturing the transistor 130 over a substrate 101 is described below with reference to FIGS. 6A to 6D. Note that in FIGS. 6A to 6D, the same portions as those in FIGS. 1A to 1C are denoted by the same reference numerals.

First, as well as in Embodiment 1, a base insulating layer 102 is formed over a substrate 101 having an insulating surface.

Next, an oxide semiconductor film is formed, and then a first photolithography step is performed, so that the oxide semiconductor layer 123 is formed. FIG. 6A is a cross-sectional view of this stage. In this embodiment, as the oxide semiconductor film, an In—Zn—O film with a thickness of 50 nm is used. The target used for formation of the oxide semiconductor film by a sputtering method is, for example, an oxide target containing $In_2O_3$ and ZnO at a composition ratio of 1:2 [molar ratio], so that an In—Zn—O film is formed.

Next, the oxide semiconductor layer is subjected to heat treatment. The temperature of the heat treatment is more than or equal to 200° C. and less than or equal to 600° C. In this embodiment, heat treatment is performed in a dry air atmosphere at 200° C. for one hour with the use of an electric furnace.

Next, as in Embodiment 1, a conductive film is formed by a sputtering method, and then a second photolithography step is performed, so that a source electrode layer 104b or a drain electrode layer 104a is formed. In this embodiment, a Ti film with a thickness of 150 nm is used as the conductive film.

Next, if necessary, after the source electrode layer 104b or the drain electrode layer 104a is formed, $N_2O$ plasma treatment may be performed to the exposed In—Zn—O film.

Next, as well as in Embodiment 1, a gate insulating layer 105 which covers the source electrode layer 104b or the drain electrode layer 104a and is partly in contact with the oxide semiconductor layer is formed. In this embodiment, as the gate insulating layer 105, a silicon oxide film with a thickness of 100 nm formed by a sputtering method is used.

Next, in this embodiment, the second heat treatment is performed in a nitrogen atmosphere at a temperature more than or equal to 200° C. and less than or equal to 350° C. In this embodiment, the heat treatment is performed at 200° C. for one hour.

Next, a conductive film is formed over the gate insulating layer 105, and then a third photolithography step is performed, so that a gate electrode 106 is formed. In this embodiment, a W film with a thickness of 150 nm is used as the conductive film. FIG. 6B is a cross-sectional view of this stage.

Next, as illustrated in FIG. 6C, an insulating layer 128 covering the gate electrode 106 is formed. In this embodiment, as the insulating layer 128, a silicon oxide film with a thickness of 100 nm formed by a sputtering method is used.

Next, by a fourth photolithography step, the insulating layer 128 and the gate insulating layer 105 are selectively etched, so that an opening in which part of the oxide semiconductor layer is exposed is formed.

Next, as illustrated in FIG. 6D, plasma treatment is performed using a rare gas with the use of the gate electrode 106, the source electrode layer 104*b*, and the drain electrode layer 104*a* as masks by an ICP etching apparatus, so that a first low-resistance region 127*a* and a second low-resistance region 127*b* are formed in a self-alignment manner. In this embodiment, since plasma treatment is performed using an argon gas, argon is added to an area in the range of 5 nm from a surface of the exposed oxide semiconductor layer. Therefore, the first low-resistance region 127*a* and the second low-resistance region 127*b* are formed in the vicinity of the surface of the oxide semiconductor layer.

Through the above described steps, the transistor 130 including the channel formation region which overlaps with the gate electrode 106 with the gate insulating layer 105 interposed therebetween and including the first low-resistance region 127*a* and the second low-resistance region 127*b* in contact with a channel formation region, so that concentration of an electric field applied to a drain terminal is relieved, can be manufactured.

Embodiment 4

The appearance and a cross section of a liquid crystal display panel, which is one embodiment of a semiconductor device, will be described with reference to FIGS. 7A to 7C. FIGS. 7A and 7C are plan views of panels in each of which thin film transistors 4010 and 4011 and a liquid crystal element 4013 are sealed between a first substrate 4001 and a second substrate 4006 with a sealant 4005. FIG. 7B is a cross-sectional view taken along line M-N in FIG. 7A or FIG. 7C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 7A illustrates an example in which the signal line driver circuit 4003 is mounted by a COG method. FIG. 7C illustrates an example in which the signal line driver circuit 4003 is mounted by a TAB method.

The pixel portion 4002 and the scan line driver circuit 4004 which are provided over the first substrate 4001 include a plurality of transistors. FIG. 7B illustrates the transistor 4010 included in the pixel portion 4002 and the transistor 4011 included in the scan line driver circuit 4004 as an example. The transistor 4011 is provided over a base insulating layer 4041, and includes an oxide semiconductor layer, a gate insulating layer 4020 covering the oxide semiconductor layer, and a gate electrode over the gate insulating layer 4020. A protective insulating layer 4042 and an insulating layer 4021 are provided over the transistors 4010 and 4011.

As the transistor 4011 for a driver circuit and the transistor 4010 for a pixel, the transistor 110 in which a rare gas is added to the oxide semiconductor layer with the use of the gate electrode as a mask, so that the two low-resistance regions are formed in a self-alignment manner described in Embodiment 1 can also be used. Further, as the transistor 4011 for a driver circuit and the transistor 4010 for a pixel, the transistors 210 and 220 described in Embodiment 2 can also be used. Furthermore, as the transistor 4011 for a driver circuit, the transistor 120 described in Embodiment 1 can also be used. In this embodiment, the transistors 4010 and 4011 are n-channel transistors.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

As the first substrate 4001 and the second substrate 4006, a light-transmitting substrate can be used; a plastic substrate such as a polyester film or an acrylic resin film, a glass substrate, a ceramic substrate, or the like can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. The counter electrode layer 4031 is electrically connected to a common potential line provided over the same substrate as the transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. In that case, since a horizontal electric field mode is used, the arrangement of the electrodes are different from that showed in FIG. 7B. For example, a pixel electrode layer and a common electrode layer are arranged in over one insulating layer and a horizontal electric field is applied to a liquid crystal layer. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

Note that this embodiment can also be applied to a transflective liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided in this order on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided in a portion other than the display portion.

Over the transistors 4010 and 4011, the protective insulating layer 4042 is formed to be in contact with the gate electrode. The protective insulating layer 4042 can be formed using a material and a method which are similar to those of the insulating layer 128 described in Embodiment 3. In order to reduce the surface roughness caused by the transistors, the insulating layer 4021 serving as a planarization insulating film is formed to cover the protective insulating layer 4042.

Further, the insulating layer 4021 serving as a planarization insulating film can be formed using an organic material having heat resistance such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an inkjet method, a screen printing method, or an offset printing method). When the insulating layer 4021 is formed by any one of these coating methods, a doctor knife, a roll coater, a curtain coater, or a knife coater can be used.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as a source electrode and a drain electrode of the transistors 4010 and 4011.

The connection terminal electrode 4015 is electrically connected to a terminal included in the FPC 4018 via an anisotropic conductive film 4019.

Note that FIGS. 7A to 7C illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Embodiment 5

In this embodiment, application examples of a semiconductor device according to one embodiment of the disclosed invention will be described with reference to FIGS. 8A-1, 8A-2 and 8B. Here, an example of a memory device will be described. Note that in each of circuit diagrams, "OS" may be written beside a transistor in order to indicate that the transistor includes an oxide semiconductor.

Figures 1, 8A:
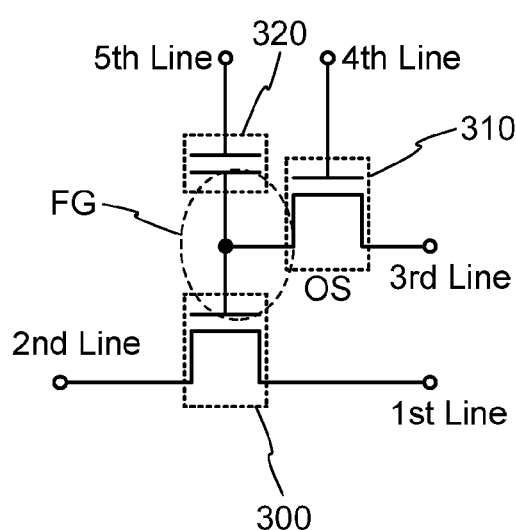

In the semiconductor device illustrated in FIG. 8A-1, a first wiring (a 1st Line) is electrically connected to a source electrode layer of a transistor 300, and a second wiring (a 2nd Line) is electrically connected to a drain electrode layer of the transistor 300. A third wiring (a 3rd Line) is electrically connected to one of a source electrode layer and a drain electrode layer of a transistor 310, and a fourth wiring (a 4th Line) is electrically connected to a gate electrode of the transistor 310. A gate electrode of the transistor 300, the other of the source electrode layer and the drain electrode layer of the transistor 310, and one electrode of a capacitor 320 are electrically connected to one another. Further, a fifth wiring (a 5th line) and the other electrode of the capacitor 320 are electrically connected to each other.

A transistor including the oxide semiconductor described in any one of Embodiments 1 to 3 is used as the transistor 310. A transistor including an oxide semiconductor has a characteristic of a significantly small off current. For that reason, a potential of the gate electrode of the transistor 300 can be held for an extremely long time by turning off the transistor 310. Provision of the capacitor 320 facilitates holding of charge given to the gate electrode of the transistor 300 and reading of stored data.

Note that there is no particular limitation on the transistor 300. In terms of increasing the speed of reading data, it is preferable to use, for example, a transistor with high switching rate such as a transistor formed using a single crystal silicon wafer or an SOI substrate.

Figure 8B:
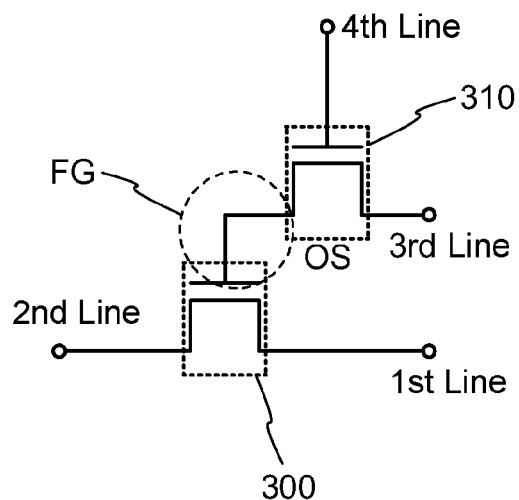
Figures 2, 8A:
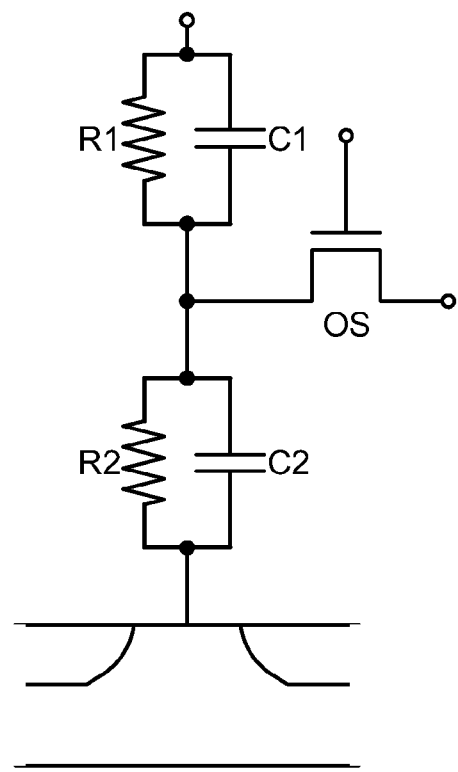

Further, as illustrated in FIG. 8B, a structure in which the capacitor 320 is not provided can also be employed.

The semiconductor device in FIG. 8A-1 utilizes the advantage that the potential of the gate electrode of the transistor 300 can be held, whereby writing, holding, and reading of data can be performed as described below.

Description is made on writing operation and holding operation of data first. A potential of the fourth wiring is set to a potential at which the transistor 310 is turned on, so that the transistor 310 is turned on. Accordingly, the potential of the third wiring is supplied to the gate electrode of the transistor 300 and the capacitor 320. That is, predetermined charge is applied to the gate electrode of the transistor 300 (writing operation). Here, one of charges for supply of two different potentials (hereinafter, a charge for supply of a low potential is referred to as a charge $Q_L$ and a charge for supply of a high potential is referred to as a charge $Q_H$) is given to the gate electrode of the transistor 300. Note that charges giving three or more different potentials may be applied to improve a storage capacitor. After that, the potential of the fourth line is set to potential at which the transistor 310 is turned off, so that the transistor 310 is turned off. Thus, the charge given to the gate electrode of the transistor 300 is held (storing operation).

The off current of the transistor 310 is extremely low; thus, the charge in the gate electrode of the transistor 300 is stored for a long time.

Subsequently, operation of performing reading of information will be explained. By supplying an appropriate potential (reading potential) to the fifth wiring while a predetermined potential (constant potential) is supplied to the first wiring, the potential of the second wiring varies depending on the amount of electric charge held in the gate electrode of the transistor 300. This is because in general, when the transistor 300 is an n-channel transistor, an apparent threshold voltage $V_{th\_H}$ in the case where $Q_H$ is given to the gate electrode of the transistor 300 is lower than an apparent threshold voltage $V_{th\_L}$ in the case where $Q_L$ is given to the gate electrode of the transistor 300. Here, apparent threshold voltage refers to the potential of the fifth wiring, which is needed to turn on the transistor 300. Thus, the potential of the fifth wiring is set to potential $V_0$ intermediate between $V_{th\_H}$ and $V_{th\_L}$, whereby charge given to the gate electrode of the transistor 300 can be determined For example, in the case where $Q_H$ is given in writing, when the potential of the fifth wiring is set to $V_0$ ($>V_{th\_H}$), the transistor 300 is turned on. In the case where $Q_L$ is given in writing, even when the potential of the fifth wiring is set to $V_0$ ($>V_{th\_L}$), the transistor 300 remains in an off state. Therefore, the stored data can be read by the potential of the second wiring.

Note that in the case where memory cells are arrayed to be used, only data of desired memory cells is needed to be read. Thus, in the case where data of predetermined memory cells is read and data of the other memory cells is not read, a potential which allows the transistor 300 to be turned off regardless of a state of the gate electrode, that is, a potential lower than $V_{th\_H}$ may be applied to fifth wirings of the memory cells whose data is not to be read. Alternatively, a potential at which the transistor 300 is turned on, that is, a potential higher than $V_{th\_L}$ may be given to the fifth wiring regardless of the state of the gate electrode of the transistor 300.

Next, rewriting operation of data will be described. Rewriting of data is performed in a manner similar to that of the writing and holding of data. That is, the potential of the fourth wiring is set to a potential with which the transistor 310 is turned on, and the transistor 310 is turned on. Accordingly, the potential of the third wiring (potential related to new data) is supplied to the gate electrode of the transistor 300 and the capacitor 320. After that, the potential of the fourth wiring is set to a potential which allows the transistor 310 to be turned off, whereby the transistor 310 is turned off. Accordingly, charge related to new data is given to the gate electrode of the transistor 300.

In the semiconductor device, data can be directly rewritten by another writing of data as described above. Therefore, extracting of charge from a floating gate with the use of a high voltage needed in a flash memory or the like is not necessary and thus, reduction in operation speed, which is attributed to erasing operation, can be suppressed. In other words, high-speed operation of the semiconductor device can be realized.

When the source electrode layer or the drain electrode layer of the transistor 310 is electrically connected to the gate electrode of the transistor 300, an effect similar to that of a floating gate of a floating gate transistor used for a nonvolatile memory element can be achieved. Therefore, a portion in the drawing where the source electrode layer or the drain electrode layer of the transistor 310 is electrically connected to the gate electrode of the transistor 300 is called a floating gate portion FG in some cases. When the transistor 310 is off, the floating gate portion FG can be regarded as being embedded in an insulator and electric charge is stored in the floating gate portion FG. The amount of the off current of the transistor 310 including an oxide semiconductor is smaller than or equal to one hundred thousandth of the amount of the off current of a transistor including a silicon semiconductor or the like; thus, lost of the charge accumulated in the floating gate portion FG due to a leakage current of the transistor 310 is negligible. That is, with the transistor 310 including an oxide semiconductor, a nonvolatile memory device which can hold data without being supplied with power can be realized.

For example, when the off current of the transistor 310 at room temperature is 10 zA (1 zA (zeptoampere) is $1\times10^{-21}$ A) or less and the capacitance of the capacitor 320 is approximately 10 fF, data can be held for $10^4$ seconds or longer. It is needless to say that the storage time depends on transistor characteristics and the capacitance value.

Further, in that case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, a high voltage needed for writing or erasing in a conventional floating gate transistor is not necessary.

The components such as transistors in the semiconductor device in FIG. 8A-1 can be regarded as including a resistor and a capacitor as shown in FIG. 8A-2. That is, in FIG. 8A-2, the transistor 300 and the capacitor 320 are each regarded as including a resistor and a capacitor. R1 and C1 denote the resistance value and the capacitance value of the capacitor 320, respectively. The resistance value R1 corresponds to the resistance value which depends on an insulating layer included in the capacitor 320. R2 and C2 denote the resistance value and the capacitance value of the transistor 300, respectively. The resistance value R2 corresponds to the resistance value which depends on a gate insulating layer at the time when the transistor 300 is on. The capacitance value C2 corresponds to the capacitance value of so-called gate capacitance (capacitance formed between the gate electrode and each of the source electrode layer and the drain electrode layer and capacitance formed between the gate electrode and the channel formation region).

The resistance value (also referred to as effective resistance) between the source electrode layer and the drain electrode layer when the transistor 310 is off is denoted by ROS. When R1 and R2 satisfy the following relations of R1≧ROS (R1 is equal to or higher than ROS) and R2≧ROS (R2 is equal to or higher than ROS) under the condition that gate leakage of the transistor 310 is sufficiently small, a period for holding electric charge (also referred to as a data retention period) is determined mainly by the off current of the transistor 310.

On the other hand, when the conditions are not met, it is difficult to sufficiently secure the holding period even if the off current of the transistor 310 is small enough. This is because a leakage current other than the off current of the transistor 310 (e.g., a leakage current generated between the source electrode layer and the gate electrode) is large. Thus, it can be said that the semiconductor device disclosed in this embodiment desirably satisfies the above relation.

It is desirable that C1 be larger than or equal to C2. If C1 is large, variation in potential of the fifth wiring can be suppressed when the potential of the floating gate portion FG is controlled by the fifth wiring (e.g., at the time of reading).

When the above relation is satisfied, a more preferable semiconductor device can be realized. Note that R1 and R2 are controlled by the gate insulating layer of the transistor 300 and the insulating layer of the capacitor 320. The same relation is applied to C1 and C2. Therefore, the material, the thickness, and the like of the gate insulating layer are desirably set as appropriate to satisfy the above relation.

As described above, a semiconductor device has a nonvolatile memory cell including a writing transistor where a leakage current (off current) between a source and a drain is small in an off state, a reading transistor formed of a semiconductor material different from that of the writing transistor, and a capacitor.

The off current of the writing transistor is 100 zA or less, preferably 10 zA or less, more preferably 1 zA or less at a temperature at which the memory cell is used (e.g., 25° C.).

Such small off current is difficult to obtain with a general silicon semiconductor, but can be achieved by a transistor which is obtained by processing an oxide semiconductor under an appropriate condition. Therefore, a transistor including an oxide semiconductor layer is preferably used as the writing transistor.

Data is written to the memory cell by turning on the writing transistor so that a potential is supplied to the floating gate portion FG where one of a source electrode layer and a drain electrode layer of the writing transistor, one of electrodes of the capacitor, and a gate electrode of the reading transistor are electrically connected, and then turning off the writing transistor so that the predetermined amount of charge is held in the floating gate portion FG. Here, the off current of the writing transistor is very small; thus, the charge supplied to the floating gate portion FG is held for a long time. When an off current is, for example, substantially 0, refresh operation needed for a conventional DRAM can be unnecessary or the frequency of refresh operation can be significantly low (for example, about once a month or a year). Accordingly, power consumption of a semiconductor device can be reduced sufficiently.

Further, data can be rewritten directly by overwriting of new data to the memory cell. For that reason, erasing operation which is necessary for a flash memory or the like is not needed, so that a reduction in operation speed because of erasing operation can be prevented. In other words, high-speed operation of the semiconductor device can be realized. Moreover, a high voltage necessary for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower, preferably 3 V or lower, in each memory cell in the case where data of two stages (one bit) is written.

The memory cell provided in the semiconductor device may include at least the writing transistor, the reading transistor, and the capacitor. Further, the memory cell can operate even when the area of the capacitor is small.

In the memory cell, since data is written by a switching operation of the writing transistor, writing durability is very high. For example, in the memory cell, the current-voltage characteristic is not degraded even after data is written $1 \times 10^9$ or more times (one billion or more times).

A transistor including an oxide semiconductor described in any one of Embodiments 1 to 3 can be miniaturized. By using a miniaturized transistor, an excellent memory device as described above can be highly integrated.

Figure 9A:
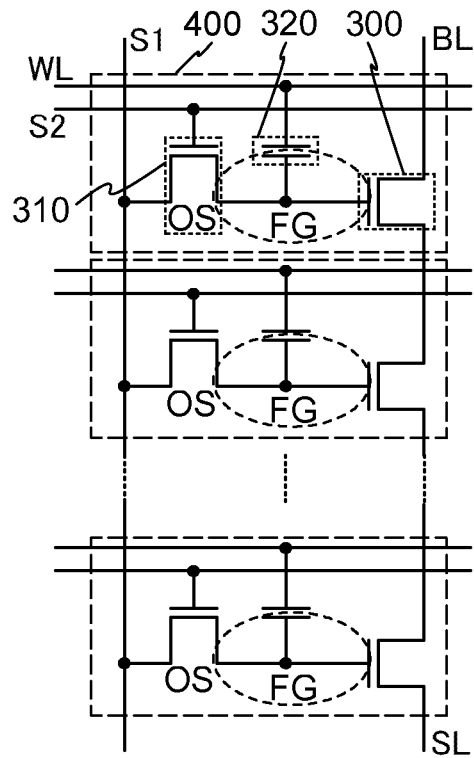
FIGS. 9A and 9B are circuit diagrams of one embodiment of the present invention.
Figure 9B:
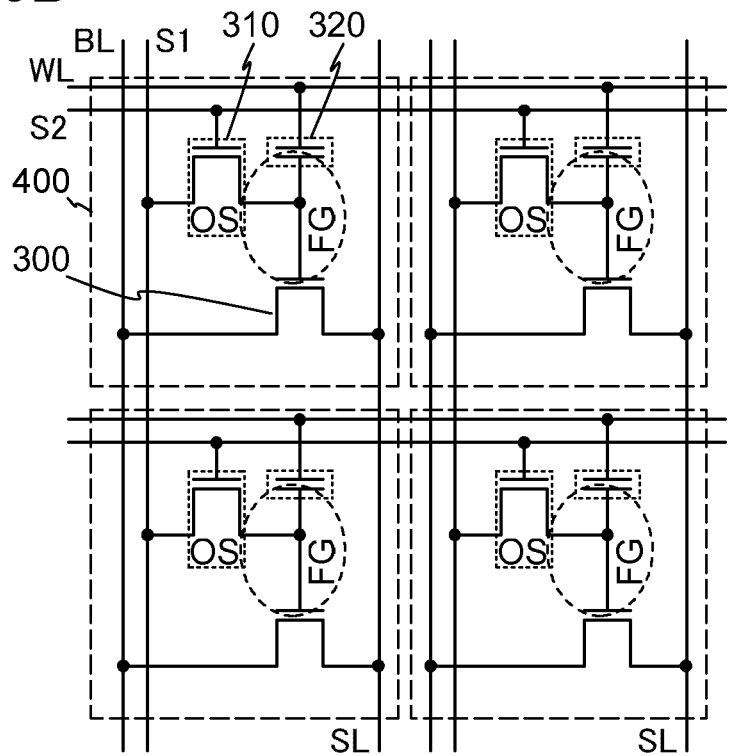

Examples in which memory devices are integrated are shown in FIGS. 9A and 9B. FIGS. 9A and 9B are examples of circuit diagrams of semiconductor devices each including a plurality of semiconductor devices (hereinafter also referred to as memory cells 400) illustrated in FIG. 8A-1. FIG. 9A is a circuit diagram of a so-called NAND semiconductor device in which the memory cells 400 are connected in series, and FIG. 9B is a circuit diagram of a so-called NOR semiconductor device in which the memory cells 400 are connected in parallel.

The semiconductor device in FIG. 9A includes a source line SL, a bit line BL, a first signal line S1, a plurality of second signal lines S2, a plurality of word lines WL, and the plurality of memory cells 400. In FIG. 9A, one source line SL and one bit line BL are provided, but this embodiment is not limited to this. A plurality of source lines SL and a plurality of bit lines BL may be provided.

In each of the memory cells 400, a gate electrode of the transistor 300, one of a source electrode layer and a drain electrode layer of the transistor 310, and one of electrodes of the capacitor 320 are electrically connected to one another. The first signal line S1 and the other of the source electrode layer and the drain electrode layer of the transistor 310 are electrically connected to each other, and the second signal line S2 and the gate electrode of the transistor 310 are electrically connected to each other. The word line WL and the other of the electrodes of the capacitor 320 are electrically connected to each other.

Further, the source electrode layer of the transistor 300 included in the memory cell 400 is electrically connected to the drain electrode layer of the transistor 300 in the adjacent memory cell 400. The drain electrode layer of the transistor 300 included in the memory cell 400 is electrically connected to the source electrode layer of the transistor 300 in the adjacent memory cell 400. Note that the drain electrode layer of the transistor 300 included in the memory cell 400 of the plurality of memory cells connected in series, which is provided at one of ends, is electrically connected to the bit line. The source electrode layer of the transistor 300 included in the memory cell 400 of the plurality of memory cells connected in series, which is provided at the other end, is electrically connected to the source line.

In the semiconductor device in FIG. 9A, writing operation and reading operation are performed in each row. The writing operation is performed as follows. A potential at which the transistor 310 is turned on is supplied to the second signal line S2 of a row where writing is to be performed, so that the transistor 310 of the row where writing is to be performed is turned on. Accordingly, the potential of the first signal line S1 is supplied to the gate electrode of the transistor 300 in the specified row, so that predetermined charge is given to the gate electrode. Thus, data can be written to the memory cell of the specified row.

Further, the reading operation is performed as follows. First, a potential at which the transistors 300 are turned on regardless of charge given to the gate electrodes thereof is supplied to the word lines WL of the rows other than the row where reading is to be performed, so that the transistors 300 of the rows other than the row where reading is to be performed are turned on. Then, a potential (reading potential) at which an on state or an off state of the transistor 300 is determined depending on charge in the gate electrode of the transistor 300 is supplied to the word line WL of the row where reading is to be performed. After that, a constant potential is supplied to the source line SL so that a reading circuit (not illustrated) connected to the bit line BL is operated. Here, the plurality of transistors 300 between the source line SL and the bit line BL are on except the transistors 300 of the row where reading is to be performed; therefore, conductance between the source line SL and the bit line BL is determined by a state (an on state or an off state) of the transistors 300 of the row where reading is to be performed. Since the conductance of the transistors varies depending on the charge in the gate electrodes of the transistors 300 of the row where reading is to be performed, a potential of the bit line BL varies accordingly. By reading the potential of the bit line with the reading circuit, data can be read from the memory cells of the specified row.

The semiconductor device in FIG. 9B includes a plurality of source lines SL, a plurality of bit lines BL, a plurality of first signal lines S1, a plurality of second signal lines S2, a plurality of word lines WL, and a plurality of the memory cells 400. A gate electrode of the transistor 300, one of a source electrode layer and a drain electrode layer of the transistor 310, and one of electrodes of the capacitor 320 are electrically connected to one another. The source line SL and a source electrode layer of the transistor 300 are electrically connected to each other. The bit line BL and a drain electrode layer of the transistor 300 are electrically connected to each other. The first signal line S1 and the other of the source electrode layer and the drain electrode layer of the transistor 310 are electrically connected to each other, and the second signal line S2 and the gate electrode of the transistor 310 are electrically connected to each other. The word line WL and the other of the electrodes of the capacitor 320 are electrically connected to each other.

In the semiconductor device in FIG. 9B, writing operation and reading operation are performed in each row. The writing operation is performed in a manner similar to that in the semiconductor device illustrated in FIG. 9A. The reading operation is performed as follows. First, a potential at which the transistor 300 is turned off regardless of charge given to the gate electrode thereof is supplied to the word lines WL of the rows other than the row where reading is to be performed, so that the transistors 300 of the rows other than the row where reading is to be performed are turned off. Then, a potential (reading potential) at which an on state or an off state of the transistor 300 is determined depending on charge in the gate electrode of the transistor 300 is supplied to the word line WL of the row where reading is to be performed. After that, a constant potential is supplied to the source line SL so that a reading circuit (not illustrated) connected to the bit line BL is operated. Here, conductance between the source lines SL and the bit lines BL is determined by a state (an on state or an off state) of the transistors 300 of the row where reading is to be performed. That is, a potential of the bit lines BL depends on charge in the gate electrodes of the transistors 300 of the row where reading is to be performed. By reading the potential of the bit line with the reading circuit, data can be read from the memory cells of the specified row.

Although the amount of data which can be stored in each of the memory cells 400 is one bit in the above description, the structure of the memory device of this embodiment is not limited to this. The amount of data which is stored in each of the memory cells 400 may be increased by preparing three or more potentials to be supplied to the gate electrode of the transistor 300. For example, in the case where the number of potentials to be supplied to the gate electrode of the transistor 300 is four, data of two bits can be stored in each of the memory cells.

Next, examples of the reading circuit which can be used for the semiconductor devices in FIGS. 9A and 9B are described.

The resistance of the memory cell varies depending on stored data. Specifically, when the transistor 300 of the selected memory cell 400 is on, the memory cell 400 has a low resistance, whereas when the transistor 300 of the selected memory cell 400 is off, the memory cell 400 has a high resistance.

With the use of the reading circuit including a transistor and a sense amplifier circuit, data can be read out from the memory cell. The reading circuit may further include a precharge circuit.

The methods and structures described in this embodiment can be combined as appropriate with any of the methods and structures described in the other embodiments.

Embodiment 6

A semiconductor device disclosed in this specification can be applied to a variety of electronic devices (including game machines). Examples of electronic devices are a television set (also referred to as a television or a television receiver), a monitor of a computer or the like, a digital camera, a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of electronic devices provided with a transistor having a structure which is described in any one of Embodiments 1 to 3 and in which concentration of an electric field applied to a drain terminal is relieved are described with reference to FIGS. 10A to 10E.

Figure 10A:
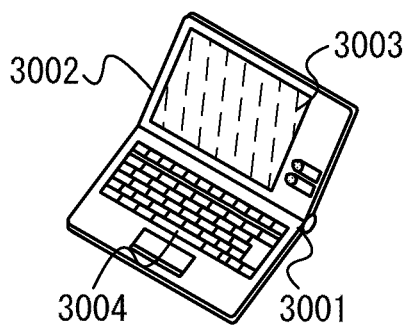
FIGS. 10A to 10E illustrate examples of electronic devices.

FIG. 10A illustrates a laptop personal computer manufactured by mounting at least a display device as a component, which includes a main body 3001, a housing 3002, a display portion 3003, a keyboard 3004, and the like. The laptop personal computer includes a display device having a transistor which can be miniaturized as shown in Embodiment 1 and having a high aperture ratio by reducing an area occupied by a transistor. Further, the laptop personal computer may include the memory device described in Embodiment 5.

Figure 10D:
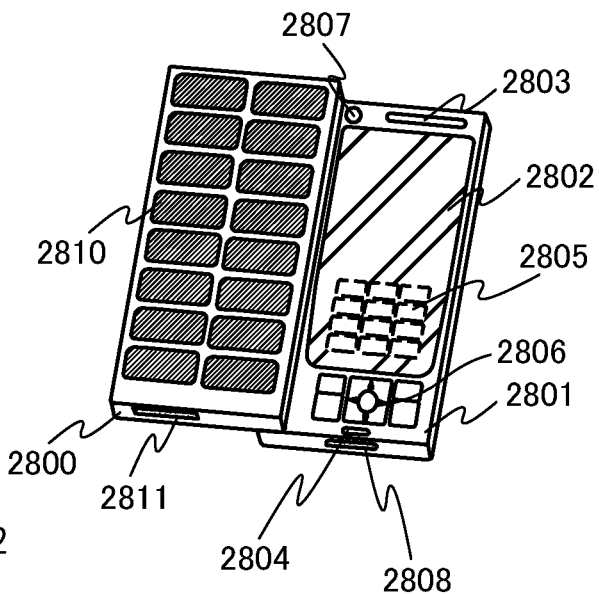
Figure 10B:
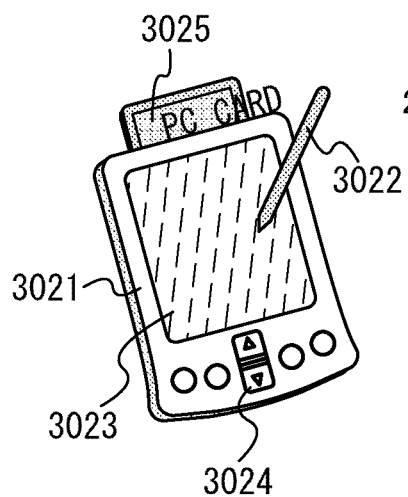

FIG. 10B is a portable information terminal (PDA) manufactured by mounting at least a display device as a component, which includes a display portion 3023, an external interface 3025, an operation button 3024, and the like in a main body 3021. A stylus 3022 is included as an accessory for operation. The portable information terminal includes a display device having a transistor which can be miniaturized as shown in Embodiment 1, and having a high aperture ratio by reducing an area occupied by a transistor. Further, the portable information terminal may include the memory device shown in Embodiment 5.

Figure 10E:
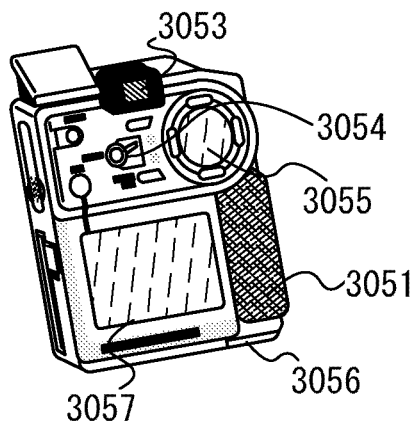
Figure 10C:
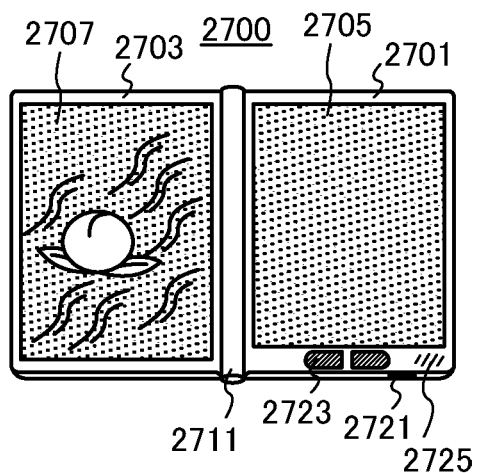

FIG. 10C is an e-book reader including a transistor having a structure in which concentration of an electric field applied to a drain terminal is relieved as described in Embodiment 2, and manufactured by mounting highly reliable electronic paper as a component. FIG. 10C is an example of the e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 10C) and graphics can be displayed on a display portion on the left side (the display portion 2707 in FIG. 10C).

FIG. 10C is an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 10D is a mobile phone manufactured by mounting as a component a display device including a transistor which can be miniaturized as shown in Embodiment 1 and having a high aperture ratio by reducing an area occupied by a transistor. The mobile phone includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging of the portable information terminal, an external memory slot 2811, and the like. Further, an antenna is incorporated in the housing 2801.

Furthermore, the display panel 2802 is provided with a touch panel. A plurality of operation keys 2805 which are displayed as images is illustrated by dashed lines in FIG. 10D. Note that a boosting circuit by which a voltage output from the solar cell 2810 is increased to be sufficiently high for each circuit is also included. A transistor having a structure in which concentration of an electric field applied to a drain terminal is relieved as shown in Embodiment 2 is used in the boosting circuit, whereby reliability can be improved.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are opened as illustrated in FIG. 10D can be slid so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved. As the recording medium, the semiconductor device described in Embodiment 5 can be used. According to Embodiment 5, with the use of the transistor in which the off current can be sufficiently reduced, a semiconductor device capable of holding stored data for an extremely long time can be obtained.

Further, in addition to the above functions, an infrared communication function, a television reception function, or the like may be provided.

FIG. 10E is a digital camera manufactured by mounting as a component a display device including a transistor which can be miniaturized as shown in Embodiment 1 and having a high aperture ratio by reducing an area occupied by a transistor. The digital camera includes a main body 3051, a display portion (A) 3057, an eye piece portion 3053, an operation switch 3054, a display portion (B) 3055, a battery 3056, and the like.

This embodiment can be freely combined with any one of Embodiments 1 to 5.

Example 1

The following experiment was carried out, and it was confirmed that resistance of the oxide semiconductor layer is reduced by plasma treatment using an argon gas.

An In—Zn—O film with a thickness of 50 nm was formed over a glass substrate. The In—Zn—O film was formed under the following conditions: an oxide target containing $In_2O_3$ and ZnO at 1:2 [molar ratio] (4 inches in diameter) was used, the flow rate of an argon gas was 10.5 sccm, the flow rate of oxygen was 4.5 sccm, the substrate temperature was 300° C., and the power was 100 W.

After the In—Zn—O film was formed, plasma treatment using an argon gas was performed on the In—Zn—O film under the following conditions: the flow rate of the argon gas was 100 sccm, and plasma was generated with a pressure of 1.5 Pa by applying an RF (13.56 MHz) power of 300 W to a coil type electrode. The substrate temperature was 70° C. and an RF (13.56 MHz) power of 80 W was also applied to the substrate side (sample stage) to apply substantially negative bias voltage.

The resistivity of the In—Zn—O film just after the film formation was approximately 2.96 Ω·cm; however, it was confirmed that the resistivity was reduced to approximately 0.01 Ω·cm by irradiating the film with argon plasma for 20 seconds. Even when the plasma irradiation time was performed for a longer time, i.e., 40 seconds, 60 seconds, 80 seconds, and 100 seconds, the resistivity was approximately 0.01 Ω·cm in each case.

Figure 11:
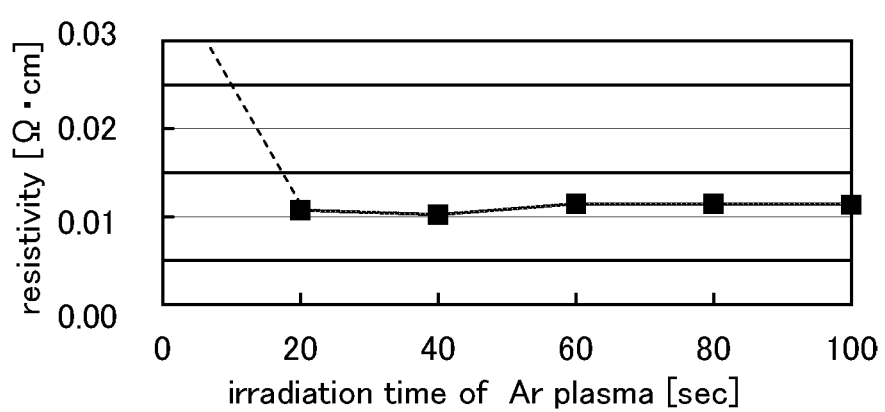
FIG. 11 is a graph showing a relationship between the irradiation time of plasma and the resistivity.

FIG. 11 shows the experimental results. In FIG. 11, the vertical axis represents the resistivity and the horizontal axis represents the argon plasma irradiation time. Note that the resistivity of the In—Zn—O film just after the film formation was approximately 2.96 Ω·cm, which is not shown in the graph of FIG. 11.

This application is based on Japanese Patent Application serial no. 2010-035423 filed with Japan Patent Office on Feb. 19, 2010, the entire contents of which are hereby incorporated by reference.

EXPLANATION OF REFERENCE

101: substrate, 102: base insulating layer, 103: oxide semiconductor layer, 104a: drain electrode layer, 104b: source electrode layer, 105: gate insulating layer, 106: gate electrode, 107a: first region, 107b: second region, 107c: channel formation region, 107d: first low-resistance region, 107e: second low-resistance region, 110: transistor, 116: gate electrode, 117d: low-resistance region, 120: transistor, 123: oxide semiconductor layer, 127a: first low-resistance region, 127b: second low-resistance region, 128: insulating layer, 130: transistor, 200: transistor, 201: substrate, 202: base insulating layer, 203: oxide semiconductor layer, 204a: drain electrode layer, 204b: source electrode layer, 205: gate insulating layer, 206: gate electrode, 207a: first low-resistance region, 207b: second low-resistance region, 207c: channel formation region, 210: transistor, 214a: first conductive layer, 214b: second conductive layer, 217a: low-resistance region, 217b: low-resistance region, 217c: channel formation region, 220: transistor, 300: transistor, 310: transistor, 320: capacitor, 400: memory cell, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eye piece portion, 3054: operation switch, 3055: display portion B, 3056: battery, 3057: display portion A, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: gate insulating layer, 4021: insulating layer, 4030: pixel electrode layer, 4031: counter electrode layer, 4032: insulating layer, 4041: base insulating layer, and 4042: protective insulating layer.

The invention claimed is:

1. A method for manufacturing a semiconductor device, comprising the steps of:
   forming an oxide semiconductor layer over an insulating surface;
   forming a source electrode layer and a drain electrode layer over and partly in contact with the oxide semiconductor layer;
   forming an insulating layer over and in contact with the oxide semiconductor layer, the source electrode layer, and the drain electrode layer;
   forming a gate electrode over the insulating layer and overlapping with the oxide semiconductor layer; and
   adding an impurity element to a part of the oxide semiconductor layer in a self-alignment manner with the use of the gate electrode, the source electrode layer and the drain electrode layer as a mask through the insulating layer,
   wherein the impurity element is a rare gas.

2. The method for manufacturing a semiconductor device, according to claim 1, further comprising the step of forming a base insulating layer in contact with the oxide semiconductor layer by a sputtering method.

3. The method for manufacturing a semiconductor device, according to claim 1, wherein the oxide semiconductor layer is subjected to heat treatment at more than or equal to 400° C. before the impurity element is added.

4. The method for manufacturing a semiconductor device, according to claim 1, wherein the impurity element is added by an ion implantation apparatus.

5. The method for manufacturing a semiconductor device, according to claim 1, wherein the impurity element is added by an ion doping apparatus.

6. A method for manufacturing a semiconductor device, comprising the steps of:
   forming a source electrode layer and a drain electrode layer over an insulating surface;
   forming an oxide semiconductor layer over and partly in contact with the source electrode layer and the drain electrode layer;
   forming an insulating layer over and in contact with the oxide semiconductor layer, the source electrode layer, and the drain electrode layer;
   forming a gate electrode over and in contact with the insulating layer; and
   adding an impurity element to a part of the oxide semiconductor layer in a self-alignment manner with the use of the gate electrode as a mask through the insulating layer,
   wherein the gate electrode overlaps with the oxide semiconductor layer, and
   wherein the impurity element is a rare gas.

7. The method for manufacturing a semiconductor device, according to claim 6, further comprising the step of forming a base insulating layer in contact with the oxide semiconductor layer by a sputtering method.

8. The method for manufacturing a semiconductor device, according to claim 6, wherein the oxide semiconductor layer is subjected to heat treatment at more than or equal to 400° C. before the impurity element is added.

9. The method for manufacturing a semiconductor device, according to claim 6, wherein the impurity element is added by an ion implantation apparatus.

10. The method for manufacturing a semiconductor device, according to claim 6, wherein the impurity element is added by an ion doping apparatus.

11. A method for manufacturing a semiconductor device, comprising the steps of:
    forming an oxide semiconductor layer over an insulating surface;
    forming a source electrode layer and a drain electrode layer over and partly in contact with the oxide semiconductor layer;
    forming an insulating layer over and in contact with the oxide semiconductor layer, the source electrode layer, and the drain electrode layer;
    forming a gate electrode over the insulating layer and overlapping with the oxide semiconductor layer;
    etching the insulating layer selectively so that a part of the oxide semiconductor layer is exposed; and
    adding an impurity element to the exposed part of the oxide semiconductor layer.

12. The method for manufacturing a semiconductor device, according to claim 11, further comprising the step of forming a base insulating layer in contact with the oxide semiconductor layer by a sputtering method.

13. The method for manufacturing a semiconductor device, according to claim 11, wherein the oxide semiconductor layer is subjected to heat treatment at more than or equal to 400° C. before the impurity element is added.

14. The method for manufacturing a semiconductor device, according to claim 11, wherein the impurity element is a rare gas.

15. The method for manufacturing a semiconductor device, according to claim 11, wherein the impurity element is added by an ion implantation apparatus.

16. The method for manufacturing a semiconductor device, according to claim 11, wherein the impurity element is added by an ion doping apparatus.

17. The method for manufacturing a semiconductor device, according to claim 11, wherein the impurity element is added by a plasma treatment apparatus.

18. The method for manufacturing a semiconductor device, according to claim 11, wherein the impurity element is added by an ICP type etching apparatus.

* * * * *